US010978889B1

(12) United States Patent
Goldin et al.

(10) Patent No.: US 10,978,889 B1
(45) Date of Patent: Apr. 13, 2021

(54) SYSTEM AND METHODS FOR MULTI-LEVEL BATTERY PROTECTION

(71) Applicant: Hadal, Inc., Oakland, CA (US)

(72) Inventors: Aaron Goldin, Oakland, CA (US); Ben Kfir, San Francisco, CA (US); Douglas Traeger, Oakland, CA (US); Robert S. Damus, Alameda, CA (US); Richard J. Rikoski, Alameda, CA (US)

(73) Assignee: HADAL, INC., Oakland, CA (US)

(*) Notice: Subject to any disclaimer, the term of this patent is extended or adjusted under 35 U.S.C. 154(b) by 411 days.

(21) Appl. No.: 16/008,842

(22) Filed: Jun. 14, 2018

Related U.S. Application Data (60) Provisional application No. 62/519,272, filed on Jun. 14, 2017.

(51) Int. Cl.
*H02J 7/00* (2006.01)
*G01R 31/396* (2019.01)

(52) U.S. Cl.
CPC .......... *H02J 7/0026* (2013.01); *G01R 31/396* (2019.01); *H02J 7/0022* (2013.01); *H01M 2200/103* (2013.01); *H02J 7/00304* (2020.01)

(58) Field of Classification Search
CPC ...... H02J 7/0026; H02J 7/0022; G01R 31/396
See application file for complete search history.

(56) References Cited

U.S. PATENT DOCUMENTS

| 6,600,641 | B2* | 7/2003 | Oglesbee | G05F 1/565 |
| | | | | 361/103 |
| 7,294,000 | B2* | 11/2007 | Vera | B60R 16/0238 |
| | | | | 307/10.1 |
| 9,457,684 | B2* | 10/2016 | Crombez | B60L 58/18 |
| 2008/0304199 | A1* | 12/2008 | Cruise | H01M 10/425 |
| | | | | 361/101 |
| 2012/0099399 | A1* | 4/2012 | Lichter | G01S 15/88 |
| | | | | 367/93 |

* cited by examiner

*Primary Examiner* — Scott Bauer
(74) *Attorney, Agent, or Firm* — Burns & Levinson, LLP; Christopher Carroll (57) ABSTRACT

Systems and methods are described herein for a multi-level battery protection system. In some embodiments, a multi-level battery protection system can include multiple levels at the junction box level and multiple levels at the battery level. In some embodiments, at the junction box level, the multi-level battery protection system can include junction box fuses and a current limiting circuit. In some embodiments, at the battery level, the multi-level battery protection system can include battery fuses and a microprocessor circuit.

20 Claims, 6 Drawing Sheets

SYSTEM AND METHODS FOR MULTI-LEVEL BATTERY PROTECTION

REFERENCE TO RELATED APPLICATIONS

This application claims priority to and the benefit of U.S. Provisional Patent Application No. 62/519,272, filed on Jun. 14, 2017, and entitled "System and Methods for Multi-Level Battery Protection." The entire contents of the above-referenced application are incorporated herein by reference.

STATEMENT REGARDING FEDERALLY SPONSORED RESEARCH OR DEVELOPMENT

This invention was made with government support under N00014-14-C-0085 awarded by the Office of Naval Research (ONR). The government has certain rights in the invention.

BACKGROUND

The past several decades have seen a steady increase in the number of unmanned underwater robotic systems deployed for use in the ocean. These systems are also referred to as autonomous underwater vehicles (AUVs). All of these systems are equipped with energy systems including batteries to accomplish their respective mission. Battery modules may experience high current events which may lead to battery failure. For example, for an autonomous vehicle that is first switched on, the battery module may experience a high current as the capacitors are being charged. Such an event would lead to one or more of the batteries' fuses to blow and would require opening up the battery module to replace the battery fuses after every high current event. By providing a multi-level battery protection system, the battery module can be protected against a spectrum of battery failure modes.

SUMMARY

Systems and methods are described herein for a multi-level battery protection system. In some aspects, a multi-level battery protection system can include multiple levels at the junction box level and multiple levels at the battery level. In some aspects, at the junction box level, the multi-level battery protection system can include junction box fuses and a current limiting circuit. In some aspects, at the battery level, the multi-level battery protection system can include battery fuses and a microprocessor circuit.

In one aspect, a multi-level battery protection system for an autonomous vehicle includes one or more first fuses at a junction box, a current limiting circuit, a microprocessor circuit at a battery cell, a microprocessor circuit covering the battery, and one or more second fuses at a battery. In some aspects, the one or more first fuses are rated at a first current rate and configured to blow when an electrical current through the one or more first fuses exceeds the first current rate for a first time period. In some aspects, the current limiting circuit is arranged to sense and limit the electrical current in less time than the first time period. In some aspects, the microprocessor circuit monitors at least one of a voltage and a current of the battery cell. In some aspects, the microprocessor circuit monitors at least one of a voltage and a current of the battery. In some aspects, the one or more second fuses at the battery are rated at a second current rate and the first current rate is lower than the second current rate.

In one aspect, the first plurality of fuses are rated to blow due to a high current event. In some aspects, the current limiting circuit prevents battery failure due to a short duration high current event. In one aspect, the current limiting circuit comprises at least one semiconductor component. In some aspects, the current limiting circuit comprises at least one of a current limiting diode, current regulating diode, diode connected transistor, constant current diode, junction gate field-effect transistor (JFET), JFET with shortened gate, and metal-oxide semiconductor field-effect transistor.

In one aspect, the current limiting circuit is configured to turn on and off at least one or more components of the autonomous vehicle. In some aspects, the current limiting circuit is configured to open and close at least one or more electrical connections between components of the autonomous vehicle. In one aspect, the current limiting circuit is configured to control a discharge current of a battery or battery cell. In one aspect, the current limiting circuit is configured to control a charge current of a battery and/or battery cell. In some aspects, the microprocessor circuit monitors the current of the battery and/or battery cell based on an internal resistance of the battery, battery cell, or of a resistor in series with them. In one aspect, the internal resistance of the battery cell is 10 milliohms.

In some aspects, the microprocessor circuit determines a threshold voltage based on an open circuit voltage of the battery cell. In one aspect, the microprocessor circuit determines whether the voltage of the battery cell is below the threshold voltage. In some aspects, the voltage of a battery cell ranges from 0.5 V to 10.0 V. In one aspect, the microprocessor circuit is configured to disconnect the battery and/or a battery cell in response to determining that the voltage of the battery cell is below the threshold voltage. In some aspects, the microprocessor circuit is configured to predict a state of the battery and/or a battery cell using any one of an electrochemical model, mathematical model, and electrical circuit model.

In another aspect, a method for providing multi-level battery protection for an autonomous underwater vehicle including one or more battery cells, one or more electrical loads, and a junction box providing an electrical current between the one or more battery and the one or more electrical loads comprises providing one or more first fuses at the junction box, wherein the one or more first fuses are rated at a first current rate and configured to blow when the electrical current exceeds the first current rate for a first time period, providing a current limiting circuit, wherein the current limiting circuit is arranged to sense and limit the electrical current in less time than the first time period, providing a microprocessor circuit at a battery and/or battery cell, wherein the microprocessor circuit monitors at least one of a voltage and a current of the battery and/or battery cell, and providing one or more second fuses at the battery and/or battery cell, wherein the one or more second fuses are rated at a second current rate and the first current rate is lower than the second current rate.

In yet another aspect, a multi-level battery protection system for an autonomous underwater vehicle comprises a current limiting circuit at a junction box, wherein the current limiting circuit is arranged to sense and limit the electrical current in less time than a preconfigured transient time period and a microprocessor circuit at a first battery cell, wherein the microprocessor circuit monitors at least one of a voltage and a current of the first battery cell.

In one aspect, the current limiting circuit and microprocessor circuit are configured to control a current discharge of the first battery cell. In some aspects, the current limiting circuit and microprocessor circuit are configured to disconnect the first battery cell from the system in response to determining that an operating voltage of the first battery cell is below a threshold voltage. In one aspect, the current limiting circuit is configured to add a second battery cell to the system in response to determining that an operating voltage of the first battery cell is below a threshold voltage.

Other objects, features, and advantages of the present invention will become apparent upon examining the following detailed description, taken in conjunction with the attached drawings.

BRIEF DESCRIPTION OF THE DRAWINGS

The systems and methods described herein are set forth in the appended claims.

However, for purpose of explanation, several illustrative aspects are set forth in the following figures.

DETAILED DESCRIPTION

Figure 1:
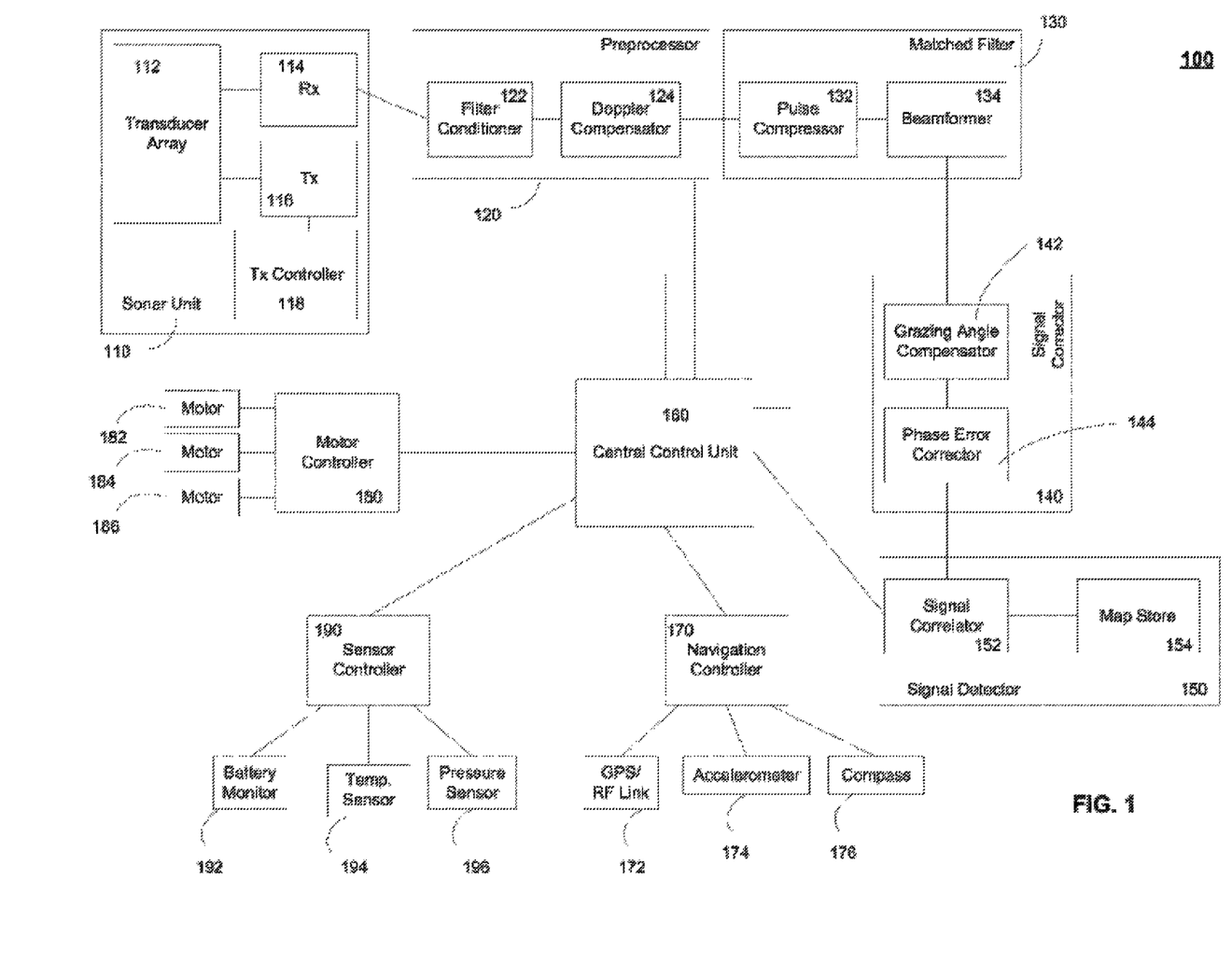
FIG. 1 is a block diagram of an exemplary remote vehicle system for implementing at least a portion of the systems and methods described in the present disclosure.

FIG. 1 is a block diagram depicting an illustrative remote vehicle, according to an illustrative embodiment of the present disclosure. The system 100 includes a sonar unit 110 for sending and receiving sonar signals, a preprocessor 120 for conditioning a received (or reflected) signal, and a matched filter 130 for performing pulse compression and beamforming. The system 100 is configured to allow for navigating using high-frequency (greater than about 100 kHz) sonar signals. To allow for such HF navigation, the system 100 includes a signal corrector 140 for compensating for grazing angle error and for correcting phase error. The system 100 also includes a signal detector 150 for coherently correlating a received image with a map. In some aspects, the system 100 includes an on-board navigation controller 170, motor controller 180 and sensor controller 190. The navigation controller 170 may be configured to receive navigational parameters from a GPS/RF link 172 (when available), an accelerometer 174, a gyroscope, and a compass 176. The motor controller 180 may be configured to control a plurality of motors 182, 184 and 186 for steering the vehicle. The sensor controller 190 may receive measurements from the battery monitor 172, a temperature sensor 194 and a pressure sensor 196. The system 100 further includes a central control unit (CCU) 160 that may serve as a hub for determining navigational parameters based on sonar measurements and other navigational and sensor parameters, and for controlling the movement of the vehicle.

In the context of a surface or underwater vehicle, the CCU 160 may determine navigational parameters such as position (latitude and longitude), velocity (in any direction), bearing, heading, acceleration and altitude. The CCU 160 may use these navigational parameters for controlling motion along the alongtrack direction (fore and aft), acrosstrack direction (port and starboard), and vertical direction (up and down). The CCU 160 may use these navigational parameters for controlling motion to yaw, pitch, roll or otherwise rotate the vehicle. During underwater operation, a vehicle such as an AUV may receive high-frequency real aperture sonar images or signals at sonar unit 110, which may then be processed, filtered, corrected, and correlated against a synthetic aperture sonar (SAS) map of the terrain. Using the correlation, the CCU may then determine the AUV's position, with high-precision and other navigational parameters to assist with navigating the terrain. The precision may be determined by the signal and spatial bandwidth of the SAS map and/or the acquired sonar image. In certain aspects, assuming there is at least a near perfect overlap of the sonar image with a prior SAS map with square pixels, and assuming that the reacquisition was performed with a single channel having a similar element size and bandwidth, and assuming little or no losses to grazing angle compensation, the envelope would be about one-half the element size. Consequently, in certain aspects, the peak of the envelope may be identified with high-precision, including down to the order of about 1/100th of the wavelength. For example, the resolution may be less than 2.5 cm, or less than 1 cm or less than and about 0.1 mm in the range direction.

As noted above, the system 100 includes a sonar unit 110 for transmitting and receiving acoustic signals. The sonar unit includes a transducer array 112 having a one or more transmitting elements or projectors and a plurality of receiving elements arranged in a row. In certain aspects the transducer array 112 includes separate projectors and receivers. The transducer array 112 may be configured to operate in SAS mode (either stripmap or spotlight mode) or in a real aperture mode. In certain aspects, the transducer array 112 is configured to operate as a multibeam echo sounder, sidescan sonar or sectors can sonar. The transmitting elements and receiving elements may be sized and shaped as desired and may be arranged in any configuration, and with any spacing as desired without departing from the scope of the present disclosure. The number, size, arrangement and operation of the transducer array 112 may be selected and controlled to insonify terrain and generate high-resolution images of a terrain or object. One example of an array 112 includes a 16 channel array with 5 cm elements mounted in a 12¾ inch vehicle.

The sonar unit 110 further includes a receiver 114 for receiving and processing electrical signals received from the transducer, and a transmitter 116 for sending electrical signals to the transducer. The sonar unit 110 further includes a transmitter controller 118 for controlling the operation of the transmitter including the start and stop, and the frequency of a ping. The signals received by the receiver 114 are sent to a preprocessor for conditioning and compensation. Specifically, the preprocessor 120 includes a filter conditioner 122 for eliminating outlier values and for estimating and compensating for hydrophone variations. The preprocessor further includes a Doppler compensator 124 for estimating and compensating for the motion of the vehicle. The preprocessed signals are sent to a matched filter 130. The matched filter 130 includes a pulse compressor 132 for performing matched filtering in range, and a beamformer 134 for performing matched filtering in azimuth and thereby perform direction estimation.

The signal corrector 140 includes a grazing angle compensator 142 for adjusting sonar images to compensate for differences in grazing angle. Typically, if a sonar images a collection of point scatterers the image varies with observation angle. For example, a SAS system operating at a fixed altitude and heading observing a sea floor path will produce different images at different ranges. Similarly, SAS images made at a fixed horizontal range would change if altitude were varied. In such cases, changes in the image would be due to changes in the grazing angle. The grazing angle compensator 142 is configured to generate grazing angle invariant images. One such grazing angle compensator is described in U.S. patent application Ser. No. 12/802,454 titled "Apparatus and Method for Grazing Angle Independent Signal Detection," the contents of which are incorporated herein by reference in their entirety. The signal corrector 140 includes a phase error corrector 144 for correcting range varying phase errors. Generally, the phase error corrector 144 breaks the image up into smaller pieces, each piece having a substantially constant phase error. Then, the phase error may be estimated and corrected for each of the smaller pieces.

The system 100 further includes a signal detector 150 having a signal correlator 152 and a storage 154. The signal detector 150 may be configured to detect potential targets, estimate the position and velocity of a detected object and perform target or pattern recognition. In one embodiment, the storage 154 may include a map store, which may contain one or more previously obtained SAS images real aperture images or any other suitable sonar image. The signal correlator 152 may be configured to compare the received and processed image obtained from the signal corrector 140 with one or more prior images from the map store 154.

The system 100 may include other components, not illustrated, without departing from the scope of the present disclosure. For example, the system 100 may include a data logging and storage engine. In certain aspects the data logging and storage engine may be used to store scientific data which may then be used in post-processing for assisting with navigation. The system 100 may include a security engine for controlling access to and for authorizing the use of one or more features of system 100. The security engine may be configured with suitable encryption protocols and/or security keys and/or dongles for controlling access. For example, the security engine may be used to protect one or more maps stored in the map store 154. Access to one or more maps in the map store 154 may be limited to certain individuals or entities having appropriate licenses, authorizations or clearances. Security engine may selectively allow these individuals or entities access to one or more maps once it has confirmed that these individuals or entities are authorized. The security engine may be configured to control access to other components of system 100 including, but not limited to, navigation controller 170, motor controller 180, sensor controller 190, transmitter controller 118, and CCU 160.

Figure 2:
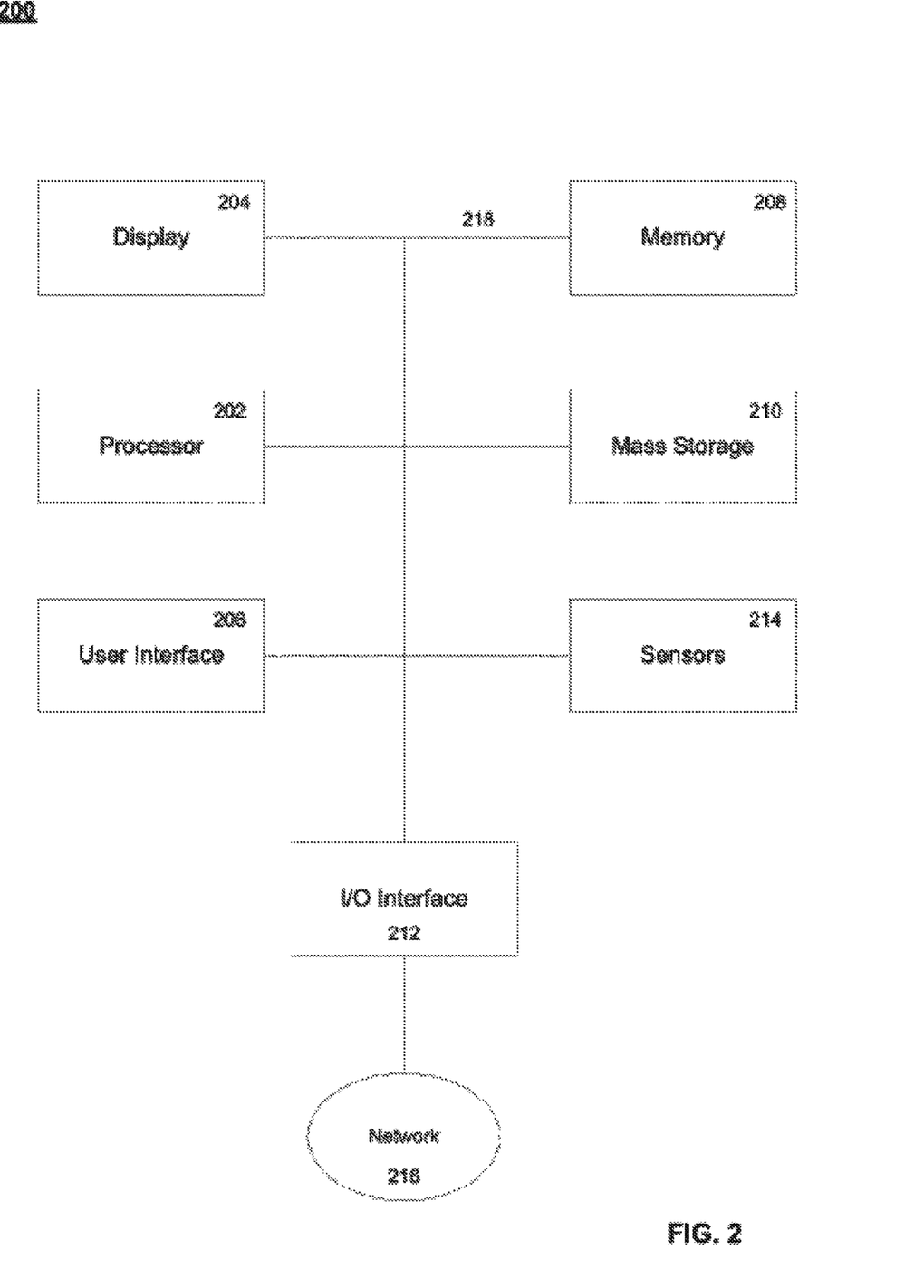
FIG. 2 is a block diagram of an exemplary computer system for implementing at least a portion of the systems and methods described in the present disclosure.

Generally, with the exception of the transducer 112, the various components of system 100 may be implemented in a computer system, such as computer system 200 of FIG. 2. More particularly, FIG. 2 is a functional block diagram of a general purpose computer accessing a network according to an illustrative embodiment of the present disclosure. The holographic navigation systems and methods described in this application may be implemented using the system 200 of FIG. 2.

The exemplary system 200 includes a processor 202, a memory 208, and an interconnect bus 218. The processor 202 may include a single microprocessor or a plurality of microprocessors for configuring computer system 200 as a multi-processor system. The memory 208 illustratively includes a main memory and a read-only memory. The system 200 also includes the mass storage device 210 having, for example, various disk drives, tape drives, etc. The main memory 208 also includes dynamic random access memory (DRAM) and high-speed cache memory. In operation and use, the main memory 208 stores at least portions of instructions for execution by the processor 202 when processing data (e.g., model of the terrain) stored in main memory 208.

In some aspects, the system 200 may also include one or more input/output interfaces for communications, shown by way of example, as interface 212 for data communications via the network 216. The data interface 212 may be a modem, an Ethernet card or any other suitable data communications device. The data interface 212 may provide a relatively high-speed link to a network 216, such as an intranet, internet, or the Internet, either directly or through another external interface. The communication link to the network 216 may be, for example, any suitable link such as an optical, wired, or wireless (e.g., via satellite or 802.11 Wi-Fi or cellular network) link. In some aspects, communications may occur over an acoustic modem. For instance, for AUVs, communications may occur over such a modem. Alternatively, the system 200 may include a mainframe or other type of host computer system capable of web-based communications via the network 216. In some aspects, the system 200 also includes suitable input/output ports or may use the Interconnect Bus 218 for interconnection with a local display 204 and user interface 206 (e.g., keyboard, mouse, touchscreen) or the like serving as a local user interface for programming and/or data entry, retrieval, or manipulation purposes. Alternatively, server operations personnel may interact with the system 200 for controlling and/or programming the system from remote terminal devices (not shown in the Figure) via the network 216.

In some aspects, a system requires a processor, such as a navigational controller 170, coupled to one or more coherent sensors (e.g., a sonar, radar, optical antenna, etc.) 214. Data corresponding to a model of the terrain and/or data corresponding to a holographic map associated with the model may be stored in the memory 208 or mass storage 210, and may be retrieved by the processor 202. Processor 202 may execute instructions stored in these memory devices to perform any of the methods described in this application, e.g., grazing angle compensation, or high frequency holographic navigation.

The system may include a display 204 for displaying information, a memory 208 (e.g., ROM, RAM, flash, etc.) for storing at least a portion of the aforementioned data, and a mass storage device 210 (e.g., solid-state drive) for storing at least a portion of the aforementioned data. Any set of the aforementioned components may be coupled to a network 216 via an input/output (I/O) interface 212. Each of the aforementioned components may communicate via interconnect bus 218.

In some aspects, the system requires a processor coupled to one or more coherent sensors (e.g., a sonar, radar, optical antenna, etc.) 214. The sensor array 214 may include, among other components, a transmitter, receive array, a receive element, and/or a virtual array with an associated phase center/virtual element.

Data corresponding to a model of the terrain, data corresponding to a holographic map associated with the model, and a process for grazing angle compensation may be performed by a processor 202. The system may include a display 204 for displaying information, a memory 208 (e.g., ROM, RAM, flash, etc.) for storing at least a portion of the aforementioned data, and a mass storage device 210 (e.g., solid-state drive) for storing at least a portion of the aforementioned data. Any set of the aforementioned components may be coupled to a network 216 via an input/output (I/O) interface 212. Each of the aforementioned components may communicate via interconnect bus 218.

In operation, a processor 202 receives a position estimate for the sensor(s) 214, a waveform or image from the sensor(s) 214, and data corresponding to a model of the terrain, e.g., the sea floor. In some aspects, such a position estimate may not be received and the process performed by processor 202 continues without this information. Optionally, the processor 202 may receive navigational information and/or altitude information, and a processor 202 may perform a coherent image rotation algorithm. The output from the system processor 202 includes the position to which the vehicle needs to move to.

The components contained in the system 200 are those typically found in general purpose computer systems used as servers, workstations, personal computers, network terminals, portable devices, and the like. In fact, these components are intended to represent a broad category of such computer components that are well known in the art.

It will be apparent to those of ordinary skill in the art that methods involved in the systems and methods of the invention may be embodied in a computer program product that includes a non-transitory computer usable and/or readable medium. For example, such a computer usable medium may consist of a read only memory device, such as a CD ROM disk, conventional ROM devices, or a random access memory, a hard drive device or a computer diskette, a flash memory, a DVD, or any like digital memory medium, having a computer readable program code stored thereon.

Optionally, the system may include an inertial navigation system, a Doppler sensor, an altimeter, a gimbling system to fixate the sensor on a populated portion of a holographic map, a global positioning system (GPS), a long baseline (LBL) navigation system, an ultrashort baseline (USBL) navigation, or any other suitable navigation system.

Figure 3:
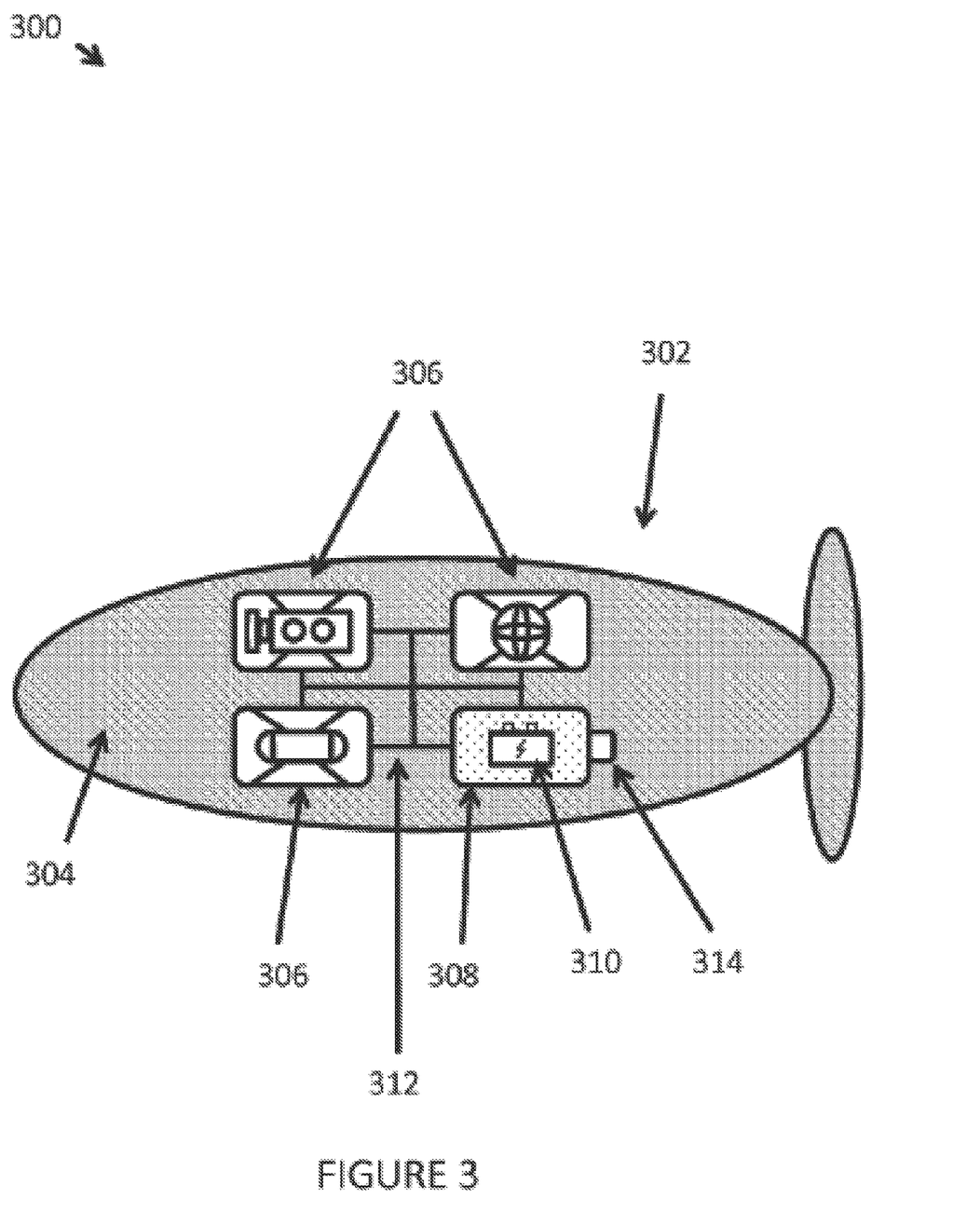
FIG. 3 is a block diagram depicting an exemplary remote vehicle, according to an illustrative aspect of the present disclosure.

FIG. 3 is a block diagram depicting an exemplary remote vehicle, according to an illustrative aspect of the present disclosure. Such an exemplary remote or autonomous vehicle includes a main body 302, along with a drive unit 304. For example, the drive unit 304 may be a propeller. The remote vehicle includes internal components, which may be located within different compartments within the main body 302. For example, the main body 302 may house a component 306. For example, the component 306 may be a sonar unit. Similarly, the main body 302 may house a pressure tolerant energy system 310, which may include a computer system, as described for example in FIG. 1 and FIG. 2. In addition, the remote or autonomous vehicle includes a power generating system 308. For example, the power generating system 308 may be a stack of battery elements, each comprising a stack of battery cells.

Large batteries use large arrays of cells. A series connection (with or without other parallel connections) may be required to meet specific power requirements. Any imbalance between cells may affect battery performance. If charging cells in series, charging is only desirable until one of the cells reaches its maximum cell voltage—proceeding with charging beyond that point would result in cell damage and/or may cause fire or explosion through the battery.

A vehicle, for example an underwater vehicle, may be powered by an array of battery packs, each battery pack comprising battery cells. These battery cells may comprise any suitable battery for providing energy to a vehicle, including, but not limited to, any suitable battery chemistry, a lithium battery, lithium-ion battery, lithium polymer battery, or a lithium sulfur battery. The battery cells may be in a matrix, or the battery cells may be arranged, aligned, or positioned in any suitable arrangement. In some aspects, the battery cells may be stacked on top of each other. In such aspects, the battery cells may include a separator between each vertically-stacked cell. The one or more battery cells may be positioned on a tray, wherein the tray provides structural support, alignment, and electrical insulation for the one or more battery cells. A backplane may connect the battery cells to management circuitry, described in further detail below. In alternate aspects, battery cells may be directly connected to the management circuitry. In some aspects, the battery cells may be connected to management circuitry through a communication network. A communication network may be any suitable network for communicating control signals. The management circuitry may comprise a pressure tolerant circuit board that may be manually programmed using any suitable programming language. In some aspects, a temperature sensor may be connected to the battery cells, either directly or through backplane. The battery cells may be configured to communicate cell health information, including at least a voltage and temperature, to the management circuitry. The management circuitry may include a water-intrusion detection circuit board, which may comprise a conductive trace that drops in resistance in the presence of water.

The primary factors that affect mission duration and sensor payload capability of an autonomous vehicle include the performance of the battery modules, including their ability to charge and discharge. Equally important for certain cell chemistries (e.g., Lithium Ion) is circuitry used in the management of the battery components. A battery manager (BMGR) may be configured to interface with the outside world and to protect the battery (by disconnecting the charge input and/or discharge output) if voltage or temperature safety limits are exceeded. The BMGR may shut down the battery immediately if it detects any individual cell voltage above the max cell voltage, or if any individual cell temperature exceeds a manufacturer recommended maximum temperature. The BMGR may disable charging of the battery system if any cell temperature is below a manufacturer recommended minimum temperature. The BMGR may disable discharging of the battery system if any cell temperature is below a manufacturer recommended minimum temperature for discharge, which may differ from the charge limit temperature. An over-discharge protection feature may be activated at any time, which will also shut down the battery if any individual cell voltage drops below a manufacturer recommended minimum cell voltage. To prevent an over-current condition, the battery system may be equipped with a pressure tolerant fuse in series with the positive terminal, and the BMGR may provide a controllable dual disconnect (high and low side switches). Further details regarding an exemplary pressure tolerant fuse are provided in U.S. Patent Application Publication No. 2012/0281503, the entire contents of which are incorporated herein by reference. This provides a safety feature by requiring two concurrent failures to happen before an uncommanded output voltage can be presented at the battery output.

Figure 4:
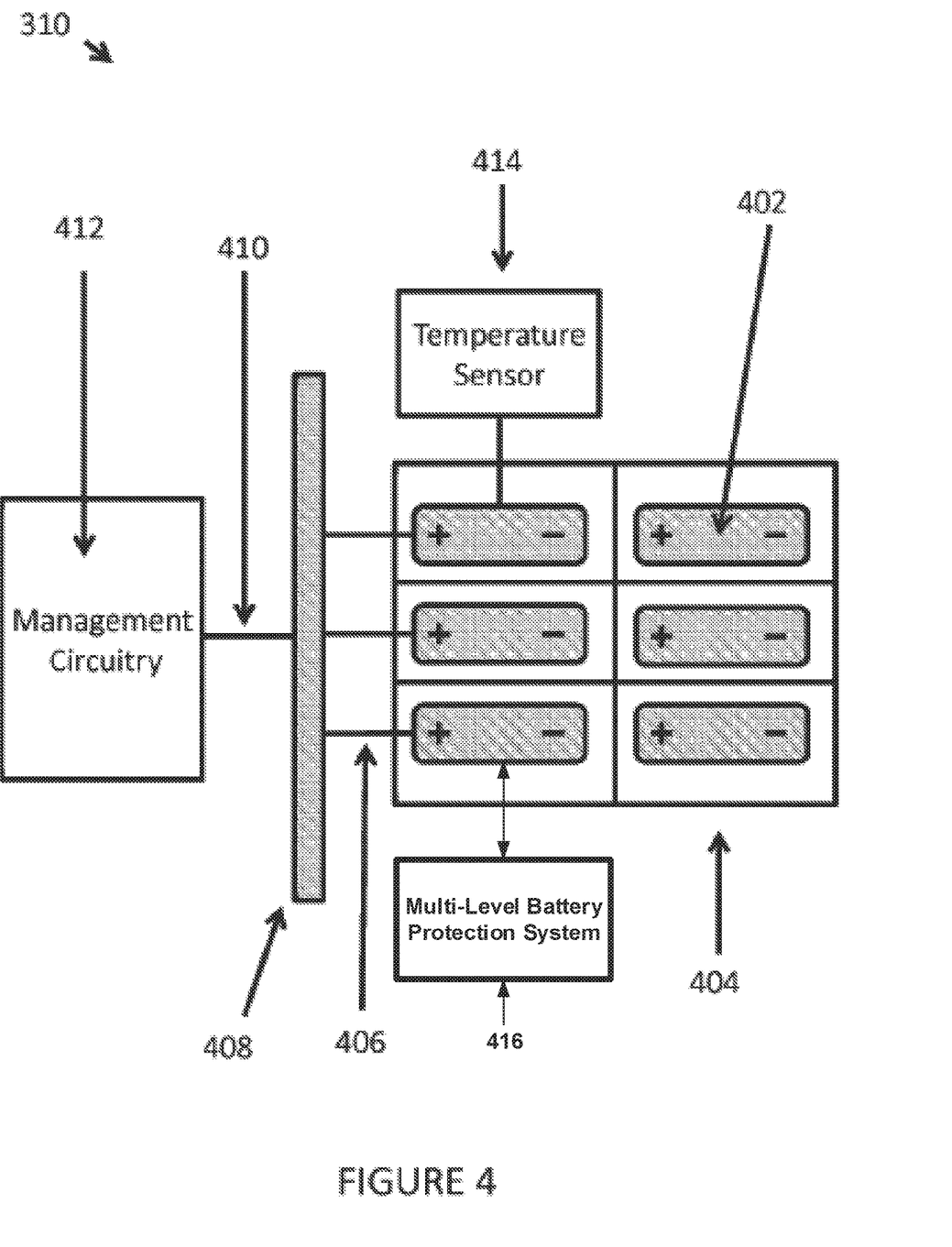
FIG. 4 is a block diagram depicting an illustrative example of a pressure tolerant energy system, according to an illustrative embodiment of the present disclosure.

FIG. 4 is a block diagram depicting an illustrative example of a pressure tolerant energy system, such as the pressure tolerant energy system 310 depicted in FIG. 3. The pressure tolerant energy system 310 may comprise one or more battery cells 402, tray 404, electrical connections 406, backplane 408, communication network 410, management circuitry 412, a temperature sensor 414, and a multi-level battery protection system 416.

The battery cells 402 may comprise any suitable battery for providing energy to an underwater vehicle, including, but not limited to, a lithium battery, lithium-ion battery, lithium polymer battery, or a lithium sulfur battery. In some aspects, the battery cells 402 may be neutrally buoyant (e.g., compared to fresh water or sea/ocean water). Although the battery cells 402 are depicted in FIG. 4 in a 3×2 matrix, the battery cells 402 may be arranged, aligned, or positioned in any suitable arrangement. In some aspects, the battery cells 402 may be stacked on top of each other. In such aspects, the battery cells 402 may include a separator between each vertically-stacked cell.

The battery cells 402 may be placed into tray 404. The tray 404 may be made from any suitable material, such as thermoformed plastic. The tray 404 may provide structural support, alignment, and electrical insulation for the battery cells 402.

The battery cells 402 may be electrically and/or structurally connected to backplane 408. The backplane may provide both structural support and alignment for the battery cells 402. The backplane may also connect to an energy distribution system, such as energy distribution system 312 depicted in FIG. 3. In alternate aspects, the battery cells 402 may be connected directly to an energy distribution system.

The backplane may connect the battery cells 402 to the management circuitry 412. In alternate aspects, battery cells 402 may be directly connected to the management circuitry 412. In some aspects, the battery cells 402 may be connected to management circuitry 412 through communication network 410. Communication network 410 may be any suitable network for communicating control signals. The management circuitry 412 may comprise a pressure tolerant circuit board that may be manually programmed using any suitable programming language. In some aspects, a temperature sensor may be connected to the battery cells 402, either directly or through backplane 408. The battery cells 402 may be configured to communicate cell health information, including at least a voltage and temperature, to the management circuitry 412. The management circuitry 412 may include a water-intrusion detection circuit board, which may comprise a conductive trace that drops in resistance in the presence of water. The battery cells 402 may be connected to the multi-level battery protection system 416. The multi-level battery protection system is described in FIG. 5.

Figure 5:
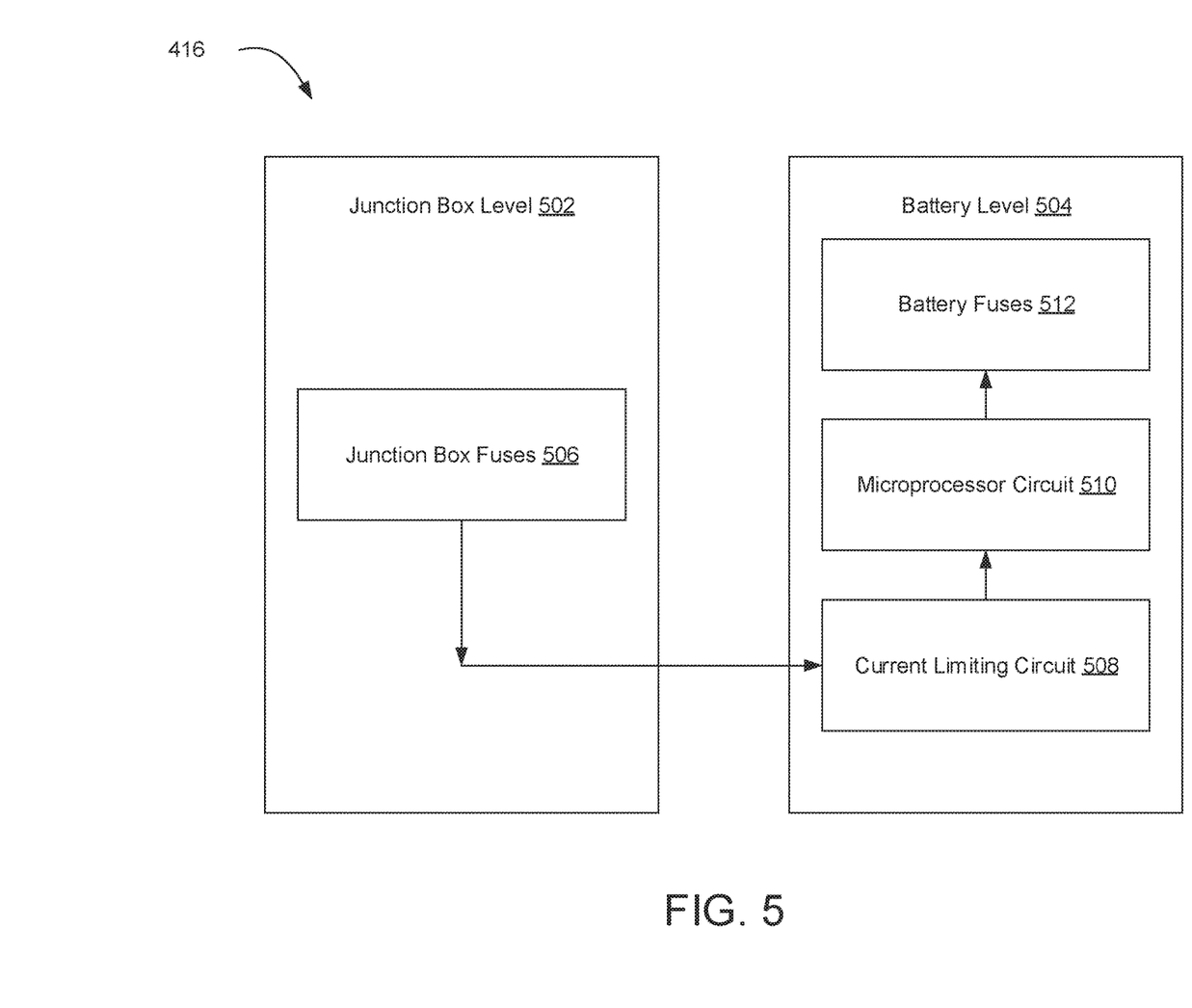
FIG. 5 is a block diagram depicting an illustrative example of a multi-level battery protection system, according to an illustrative embodiment of the present disclosure.

FIG. 5 is a block diagram depicting an illustrative example of a multi-level battery protection system, such as the multi-level battery protection system 416 depicted in FIG. 4. The multi-level battery protection system 416 may include multiple levels at the junction box level 502 and multiple levels at the battery cell level 504. In some aspects, at the junction box level 502, the multi-level battery protection system 416 can include junction box fuses 506. In some aspects, at the battery cell level 504, the multi-level battery protection system 416 may include battery fuses 510, a microprocessor circuit 512, and a current limiting circuit (CLC) 508. In one aspect, at the junction box level 502, the multi-level battery protection system 416 can include the CLC 508.

At the junction box level 502, the junction box fuses 506 provide the first layer of defense against high current events and battery failure. In some embodiments, the junction box fuses 506 can be rated at the lowest current rate compared with the other levels of protection. If, during a high current event, one or more of the junction box fuses 506 were to blow due to the high current, only the junction box fuses 506 that blew would be required to be replaced. For example, for an autonomous vehicle that experiences a high current event, opening up the junction box to replace the junction box fuses 506 would be much simpler and faster than having to access or open multiple battery modules.

The next layer of defense against high current events and battery failure at the battery level 504 is a current limiting circuit 508. The current limiting circuit 508 prevents battery failure during short duration high current events. The current limiting circuit 508 is designed for transient loads in order to sense and throttle current in less time than it takes to blow a fuse or a MOSFET. For example, for an autonomous vehicle that is first switched on, the high current transient that results from charging the capacitors would be throttled such that the current does not exceed the battery module current rating. Protection against high current transient events is especially critical with autonomous vehicles due to the procedures used to save power by going into sleep mode when possible. In one configuration, the current limiting circuit 508 includes one or more semiconductor components. A semiconductor component may include a current limiting diode (CLD), current regulating diode, diode connected transistor, constant current diode, JFET, JFET with shortened gate, and/or a MOSFET.

Conventional batteries for underwater vehicles are typically not sophisticated with respect to voltage control, current control, and/or current limiting, especially during transient power or current conditions. For example, during initial power up of an underwater energy system, which may include power up of a computer, power up of a motor, charging of capacitors within the energy system, and/or an initial charging surge of current to the batteries, the energy system may experience a transient surge of current. The CLC 508 may be configured to turn one or more components that are connected to the energy system on and off to regulate or limit the current drawn on the energy system. The CLC 508 may limit the current by opening and closing an electrical connection between the energy system and one or more electrical components connected to the energy system. The CLC 508 may periodically connect/disconnect one or more electrical components in a manner such that the current is limited by modulating the load on the energy system. The CLC 508 may function during a charging operation of the energy system's batteries by controlling the current from an external charging energy source. The CLC 508 may function during discharge operations of the energy system's batteries by controlling the discharge current from one or more batteries. In one implementation, the CLC 508 controls the discharge current from each battery individually or collectively. In one implementation, the CLC 508 controls the discharge current from each battery cell 402 individually or collectively. In one configuration, the CLC 508 resides in or is located in proximity with one or more battery cells 402. In another configuration, the CLC 508 is distributed among one or more components such as the junction box, the battery, or a battery cell.

At the battery cell level 504, a microprocessor circuit 510 can provide an additional layer of defense. During high current events, batteries often trip off based on sagging cell voltage. Once one battery turns off, the remaining batteries must source more current. This can lead to a second battery tripping off due to a sagging cell voltage, and a sudden cascading failure that results in complete vehicle shutdown. The microprocessor circuit 510 can monitor each battery cell in order to detect sag and prevent cascade failures. The microprocessor circuit 510 can monitor the voltage and current of each battery cell in order to ensure that the battery cell does not get discharged below a threshold voltage. A power controller can make sure enough batteries are on such that cell voltages stay safely away from trigger voltages while under load. The threshold voltage can be determined based on the operational voltage of the battery cell. The operational voltage of the battery cell can range from 3.2 V to 4.2 V depending on whether the battery cell is fully charged or fully discharged. The battery cells have an internal resistance of approximately 10 milliohms. For example, if the microprocessor circuit 510 is measuring a current of 10 Amps from a battery cell, the current measurement corresponds to an approximately 0.1 V sag.

In order to prevent cascade failures due to voltage sag, the microprocessor circuit 510 can determine the open circuit voltage of the battery cell and internal resistance in order to predict sag and set voltage triggers based on the determined open circuit voltage. The microprocessor circuit 510 can use the voltage triggers to cut off or disconnect batteries or battery cells that might get damaged. In addition, the microprocessor circuit 510 can actively add batteries, add higher voltage/lower resistance cells in parallel, or remove battery cells in series to the circuit (offsetting the load to other batteries in parallel) so that voltages never sag below the threshold. The microprocessor circuit 510 can use simple Ohm's law control logic to activate and deactivate batteries to prevent cascade failures and conserve power. Additionally or alternatively, the microprocessor circuit 510 may use various battery discharge models to predict sag within battery cells. For example, circuit 510 may utilize an electrochemical model, mathematical model, or electrical (circuit) model, or combination therefore, to predict the state of one or more battery cells during charge or discharge. The electrical model may include a Thevenin-based model, Impedance-based model, or runtime-based model.

Figure 6:
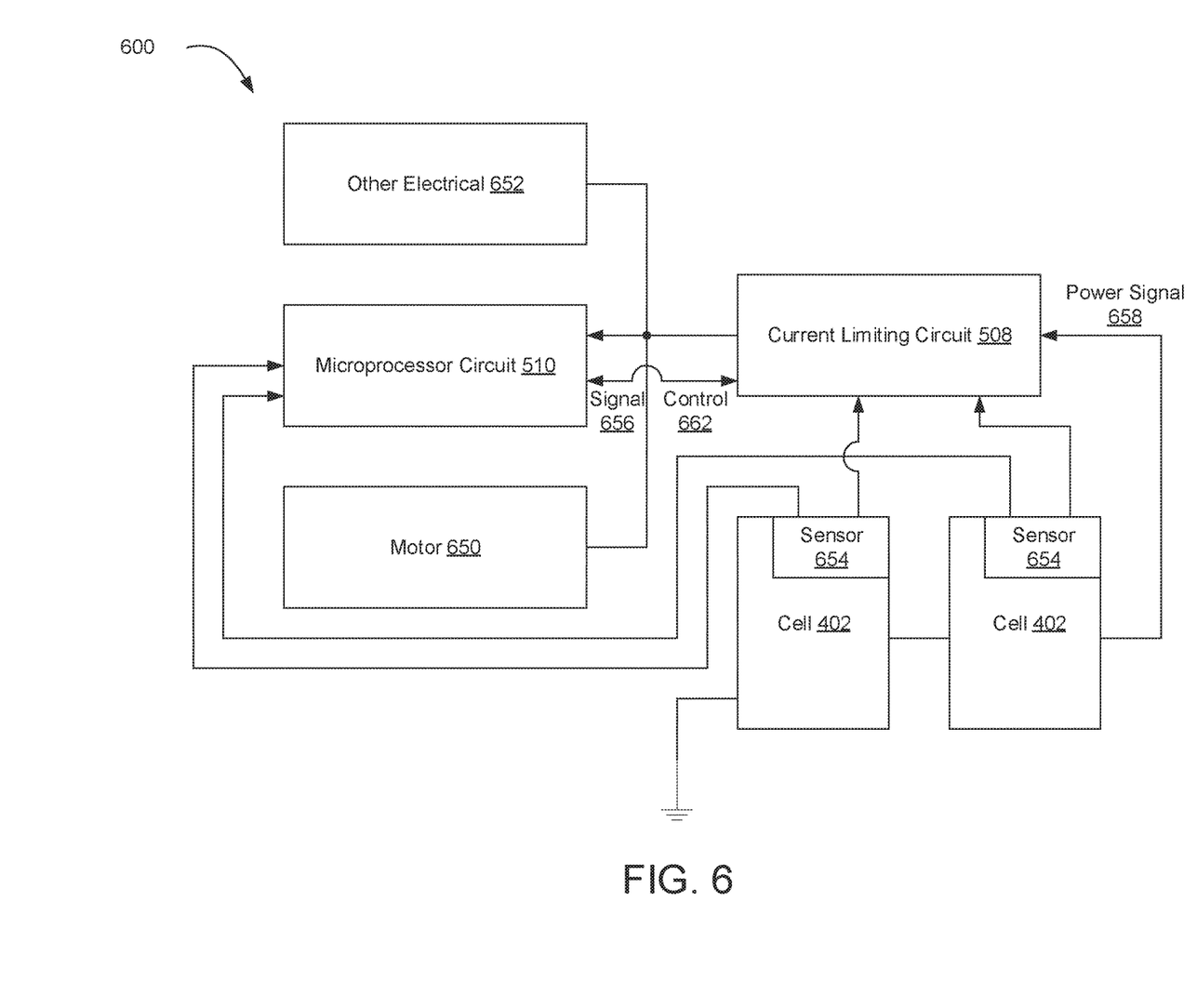
FIG. 6 is a block diagram depicting an illustrative example of a multi-level battery protection system, according to an illustrative embodiment of the present disclosure.

FIG. 6 shows a simplified circuit diagram of a battery energy system 600 including microprocessor circuit 510 and current limiting circuit 508. The microprocessor circuit 510 may operate in cooperation with the CLC 508 to control discharge of the battery cells 402 collectively or individually by, for example, connecting and disconnecting one or more battery cells 402 during charge or discharge operations. The battery cell 402 connect and disconnect circuitry is not shown in FIG. 5. However, one of ordinary skill would readily understand that circuit 510 and/or CLC 508 may control one or more electrical switches (e.g., solenoid-controlled switches) to enable electrical connect, disconnect, or bypass of one or more battery cells 402 from the energy system 600. In one implementation, a voltage and/or current sensor 654 is locate at each battery cell 402 to enable the microprocessor 510 and/or CLC 508 to monitor the voltage and/or current charge or discharge rate at each battery cell 402. In one implementation, the circuit 510 and CLC 508 are electrically connected to enable the exchange of sensor signals 656 and/or control signals 662. For example, each sensor 654 may be connected to the CLC 508, which relays the sensor signals 656 to the circuit 510. Alternatively, sensors 402 may be electrically connected to the circuit 510, which can relay monitored signals or processed sensor information to the CLC 508, which can then take action to limit current at one or more battery cells 402 or at another electrical component 652, motor 650, or circuit 510 connected to the energy system 600. In one configuration, sensors 402 are redundantly connected directly to the circuit 510 and CLC 508.

The last layer of defense against high current events and battery failure at the battery level 504 are battery fuses 512. The battery fuses 512 have a current ratting greater than the junction box fuses 506 or current limiting circuit 508 since they are designed to blow as a last resort. For example, if a failure occurs at the junction box, the battery cell fuses 512 can prevent battery failure in case of a high current event.

It will be apparent to those skilled in the art that such aspects are provided by way of example only. It should be understood that numerous variations, alternatives, changes, and substitutions may be employed by those skilled in the art in practicing the invention. Accordingly, it will be understood that the invention is not to be limited to the aspects disclosed herein, but is to be understood from the following claims, which are to be interpreted as broadly as allowed under the law.

The invention claimed is:

1. A multi-level battery protection system for an autonomous underwater vehicle, the system comprising:
   one or more first fuses at a junction box, wherein the one or more first fuses are rated at a first current rate and configured to blow when an electrical current through the one or more first fuses exceeds the first current rate for a first time period;
   a current limiting circuit, wherein the current limiting circuit is arranged to sense and limit the electrical current in less time than the first time period;
   a microprocessor circuit at a battery, wherein the microprocessor circuit monitors at least one of a voltage and a current of the battery; and
   one or more second fuses at the battery, wherein the one or more second fuses are rated at a second current rate, wherein the first current rate is lower than the second current rate.

2. The system of claim 1, wherein the first plurality of fuses are rated to blow due to a high current event.

3. The system of claim 1, wherein the current limiting circuit prevents battery failure due to a short duration high current event.

4. The system of claim 1, wherein the current limiting circuit comprises at least one semiconductor component.

5. The system of claim 4, wherein the current limiting circuit comprises at least one of a current limiting diode, current regulating diode, diode connected transistor, constant current diode, junction gate field-effect transistor (JFET), JFET with shortened gate, and metal-oxide-semiconductor field-effect transistor.

6. The system of claim 1, wherein the current limiting circuit is configured to turn on and off at least one or more components of the autonomous vehicle.

7. The system of claim 1, wherein the current limiting circuit is configured to turn on and off the battery.

8. The system of claim 1, wherein the current limiting circuit is configured to open and close at least one or more electrical connections between components of the autonomous vehicle.

9. The system of claim 1, wherein the current limiting circuit is configured to control a discharge current of the battery.

10. The system of claim 1, wherein the microprocessor circuit monitors an internal resistance of a battery cell of the battery based on the current of the battery and the voltage of the battery cell.

11. The system of claim 1, wherein the microprocessor circuit determines a threshold voltage based on an open circuit voltage of the battery.

12. The system of claim 11, wherein the microprocessor circuit determines whether the voltage of the battery is below the threshold voltage.

13. The system of claim 12, wherein the battery includes one or more battery cells and the voltage of each of the one or more battery cells ranges from 0.5 V to 10.0 V.

14. The system of claim 12, wherein the microprocessor circuit is configured to disconnect the battery in response to determining that the voltage of the battery is below the threshold voltage.

15. The system of claim 12, wherein the microprocessor circuit is configured to predict a state of the battery using any one of an electrochemical model, mathematical model, and electrical circuit model.

16. A method for providing multi-level battery protection for an autonomous underwater vehicle including one or more batteries, one or more electrical loads, and a junction box providing an electrical current between the one or more batteries and the one or more electrical loads, the method comprising:
   providing one or more first fuses at the junction box, wherein the one or more first fuses are rated at a first current rate and configured to blow when the electrical current exceeds the first current rate for a first time period;
   providing a current limiting circuit, wherein the current limiting circuit is arranged to sense and limit the electrical current in less time than the first time period;
   providing a microprocessor circuit at a battery, wherein the microprocessor circuit monitors at least one of a voltage and a current of the battery; and
   providing one or more second fuses at the battery, wherein the one or more second fuses are rated at a second current rate and the first current rate is lower than the second current rate.

17. A multi-level battery protection system for an autonomous underwater vehicle, the system comprising:
   a current limiting circuit at a junction box, wherein the current limiting circuit is arranged to sense and limit the electrical current in less time than a preconfigured transient time period; and
   a microprocessor circuit at a first battery, wherein the microprocessor circuit monitors at least one of a voltage and a current of the first battery and determines an open circuit voltage and internal resistance of a battery cell of the first battery to predict voltage sag and set a threshold voltage based on the determined open circuit voltage.

18. The system of claim 17, wherein the current limiting circuit and microprocessor circuit are configured to control a current discharge of the first battery.

19. The system of claim 17, wherein the current limiting circuit and microprocessor circuit are configured to disconnect the first battery from the system in response to determining that an operating voltage of the first battery is below the threshold voltage.

20. The system of claim 17, wherein the current limiting circuit is configured to add a second battery to the system in response to determining that an operating voltage of the first battery is below the threshold voltage.

* * * * *